(12) United States Patent
Jeong et al.

(10) Patent No.: US 8,648,335 B2
(45) Date of Patent: Feb. 11, 2014

(54) ORGANIC LIGHT EMITTING DIODE DISPLAY

(75) Inventors: Hee-Seong Jeong, Yongin (KR);
Soon-Ryong Park, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 53 days.

(21) Appl. No.: 13/180,692

(22) Filed: Jul. 12, 2011

(65) Prior Publication Data

US 2012/0043561 A1 Feb. 23, 2012

(30) Foreign Application Priority Data

Aug. 23, 2010 (KR) .......................... 10-2010-0081505

(51) Int. Cl.
*H01L 29/08* (2006.01)

(52) U.S. Cl.
USPC ............... 257/40; 257/E51.018; 257/E51.022

(58) Field of Classification Search
USPC .............................. 257/40, E51.018, E51.022
See application file for complete search history.

(56) References Cited

U.S. PATENT DOCUMENTS

| | | | |
|---|---|---|---|
| 8,106,577 B2 * | 1/2012 | Kobayashi | 313/501 |
| 2007/0200123 A1 | 8/2007 | Yamamichi et al. | |
| 2008/0286606 A1 * | 11/2008 | Hwang et al. | 428/690 |
| 2009/0160319 A1 * | 6/2009 | Song et al. | 313/504 |
| 2009/0230845 A1 * | 9/2009 | Kuma et al. | 313/504 |
| 2011/0031876 A1 * | 2/2011 | Park et al. | 313/504 |
| 2011/0168988 A1 | 7/2011 | Jeong et al. | |

FOREIGN PATENT DOCUMENTS

| | | |
|---|---|---|
| JP | 11-162653 | 6/1999 |
| JP | 2006-339028 | 12/2006 |
| KR | 10-2007-0087773 | 8/2007 |
| KR | 10-2011-0082370 A | 7/2011 |

* cited by examiner

*Primary Examiner* — A. Sefer
*Assistant Examiner* — Farid Khan
(74) *Attorney, Agent, or Firm* — Robert E. Bushnell, Esq.

(57) ABSTRACT

An organic light emitting diode display includes: a substrate; a first electrode positioned on the substrate; an organic layer positioned on the first electrode; a transflective layer positioned on the organic layer; an organic emission layer positioned on the transflective layer; and a second electrode positioned on the organic emission layer.

14 Claims, 6 Drawing Sheets

| Color of light | Thickness of organic emission layer (Å) |
|---|---|
| Red (R) | 1300 |
| Green (G) | 950 |
| Blue (B) | 700 |

FIG.7

| Cathode(MgAg) 160 Å |
| --- |
| EIL 5 Å |
| ETL 250 Å |
| EML 200 Å |
| HTL 150 Å |
| HIL 2 100 Å |
| Metal(MgAg) 120 Å |
| HIL 1 400 Å |
| ITO 70 Å |
| Ag 1000 Å |

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on Aug. 23, 2010 and there duly assigned Serial No. 10-2010-0081505.

BACKGROUND OF THE INVENTION

1. Field of the Invention

The present application relates generally to an organic light emitting diode display and, more particularly, to an organic light emitting diode display including a transflective layer.

2. Description of the Related Art

As a display which displays an image, the organic light emitting diode display has recently attracted public attention.

The known organic light emitting diode display includes a first substrate having an organic light emitting diode and a second substrate which faces the first substrate to protect the organic light emitting diode of the first substrate. The organic light emitting diode includes an organic emission layer which emits light, and a first electrode and a second electrode which face each other with the organic emission layer interposed therebetween.

The known organic light emitting diode display includes a top emission type in which light emitted from the organic light emitting diode is irradiated toward the second substrate, a bottom emission type in which the light emitted from the organic light emitting diode is irradiated toward the first substrate, and a double-sided emission type in which the light emitted from the organic light emitting diode is irradiated toward the first substrate and the second substrate.

Among them, the organic light emitting diode of the top emission type organic light emitting diode display has a first electrode having a light reflective structure and a second electrode having a light transflective structure. The top emission type organic light emitting diode display has a micro cavity structure.

The micro cavity structure serves to improve the light efficiency of each of red, green, or blue light which is emitted by each organic emission layer by implementing a kind of color filter effect. As a result, the thickness of each organic emission layer which emits the red, green, or blue light is limited, and thus the thickness is constantly determined so as to suit a wavelength of a color of light which each organic emission layer emits.

However, in the case in which the thickness of the organic emission layer is determined to be thin so as to suit the wavelength of the color of the light which each organic emission layer emits, a dark spot occurs in the light that the organic emission layer emits by a surface state of the first electrode or a particle which may be positioned in the first electrode.

The above information disclosed in this Background section is only for enhancement of an understanding of the background of the described technology, and therefore it may contain information that does not form the prior art which is already known in this country to a person of ordinary skill in the art.

SUMMARY OF THE INVENTION

The described technology has been developed in an effort to provide an organic light emitting diode display having the advantage of minimizing a dark spot which occurs in light which an organic emission layer emits while improving the light efficiency of the light which the organic emission layer emits.

An exemplary embodiment provides an organic light emitting diode display which includes: a substrate; a first electrode positioned on the substrate; an organic layer positioned on the first electrode; a transflective layer positioned on the organic layer; an organic emission layer positioned on the transflective layer; and a second electrode positioned on the organic emission layer.

A thickness acquired by adding up the organic layer, the transflective layer, and the organic emission layer may be in the range of 1000 to 3000 Å.

The organic emission layer may include a main light emitting layer for emitting blue light.

The thickness of the organic emission layer may be in the range of 600 to 800 Å.

The first electrode may be an anode, the organic layer may include a first hole injection layer adjacent to the transflective layer, and the organic emission layer may further include a second hole injection layer adjacent to the transflective layer.

The transflective layer may contain metal.

The transflective layer may contain at least one of aluminum (Al), silver (Ag), calcium (Ca), calcium-silver (CaAg), magnesium-silver (MgAg), and aluminum-silver (AlAg).

The first electrode may be light-reflective and the second electrode may be light-transflective.

According to the exemplary embodiment, the invention can minimize a dark spot which occurs in light which an organic emission layer emits while improving the light efficiency of the light which the organic emission layer emits.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 7 is a cross-sectional view illustrating primary components in an organic light emitting diode display according to an experimental example of the embodiment.

DETAILED DESCRIPTION OF THE INVENTION

Figure 1:
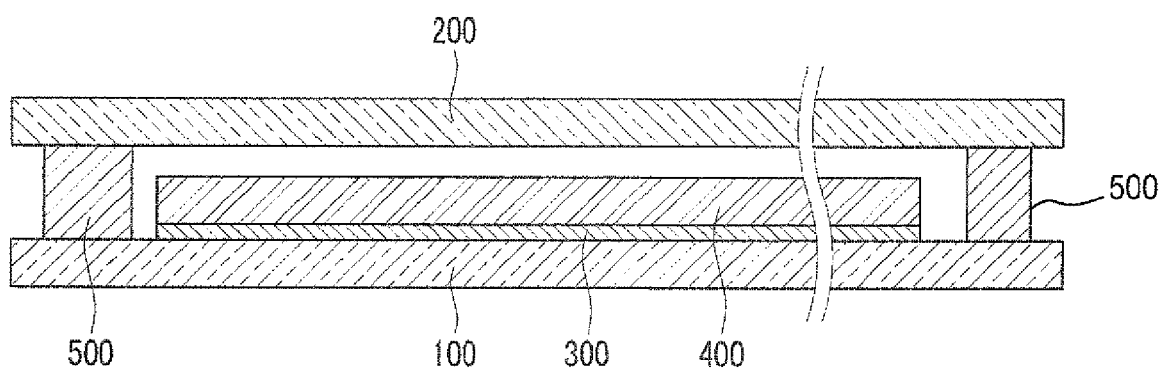
FIG. 1 is a cross-sectional view of an organic light emitting diode display according to an exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, in the specification, unless explicitly described to the contrary, the word "comprise" and variations such as "comprises" or "comprising" will be understood to imply the inclusion of stated elements but not the exclusion of any other elements. Furthermore, in the specification, "on" implies being positioned above or below a target element and does not imply being necessarily positioned on the top on the basis of a gravity direction.

Furthermore, in the accompanying drawings, although an active matrix (AM) type organic light emitting diode display having a 2Tr-1Cap structure, which is provided with two thin film transistors (TFTs) and one storage capacitor in one pixel, is shown, exemplary embodiments are not limited thereto. Accordingly, the organic light emitting diode display may be provided with three or more thin film transistors and two or more storage capacitors in one pixel, and may be configured to have various structures with additional wires. Herein, the pixel represents a minimum unit displaying an image, and the organic light emitting diode display displays the image by means of a plurality of pixels.

Hereinafter, an organic light emitting diode display according to an exemplary embodiment will be described in the reference to FIGS. 1 thru 5.

FIG. 1 is a cross-sectional view of an organic light emitting diode display according to an exemplary embodiment of the invention.

As shown in FIG. 1, the organic light emitting diode display according to the exemplary embodiment includes a first substrate 100, a second substrate 200, a wiring part 300, an organic light emitting diode 400, and a sealant 500.

The first substrate 100 and the second substrate 200 are insulating substrates including glass, polymer, stainless steel, or the like, and the second substrate 200 is made of a light transmissive material. The wiring part 300 and the organic light emitting diode 400 are positioned on the first substrate 100, and the second substrate 200 faces the first substrate 100 with the wiring part 300 and the organic light emitting diode 400 interposed therebetween. The first substrate 100 and the second substrate 200 are attached and sealed to each other by the sealant 500 with the organic light emitting diode 400 interposed therebetween. The first substrate 100 and the second substrate 200 protect the wiring part 300 and the organic light emitting diode 400 from external interference.

The wiring part 300 includes first and second thin film transistors 10 and 20 (shown in FIG. 2) and drives the organic light emitting diode 400 by transferring a signal to the organic light emitting diode 400. The organic light emitting diode 400 emits light depending on the signal received from the wiring part 300.

The organic light emitting diode 400 is positioned on the wiring part 300, which is positioned on the first substrate 100, and the organic light emitting diode 400 receives the signal from the wiring part 300 so as to display an image by using the received signal.

Hereinafter, the internal structure of the organic light emitting diode display according to the exemplary embodiment will be described in detail with reference to FIGS. 2 and 3.

Figure 2:
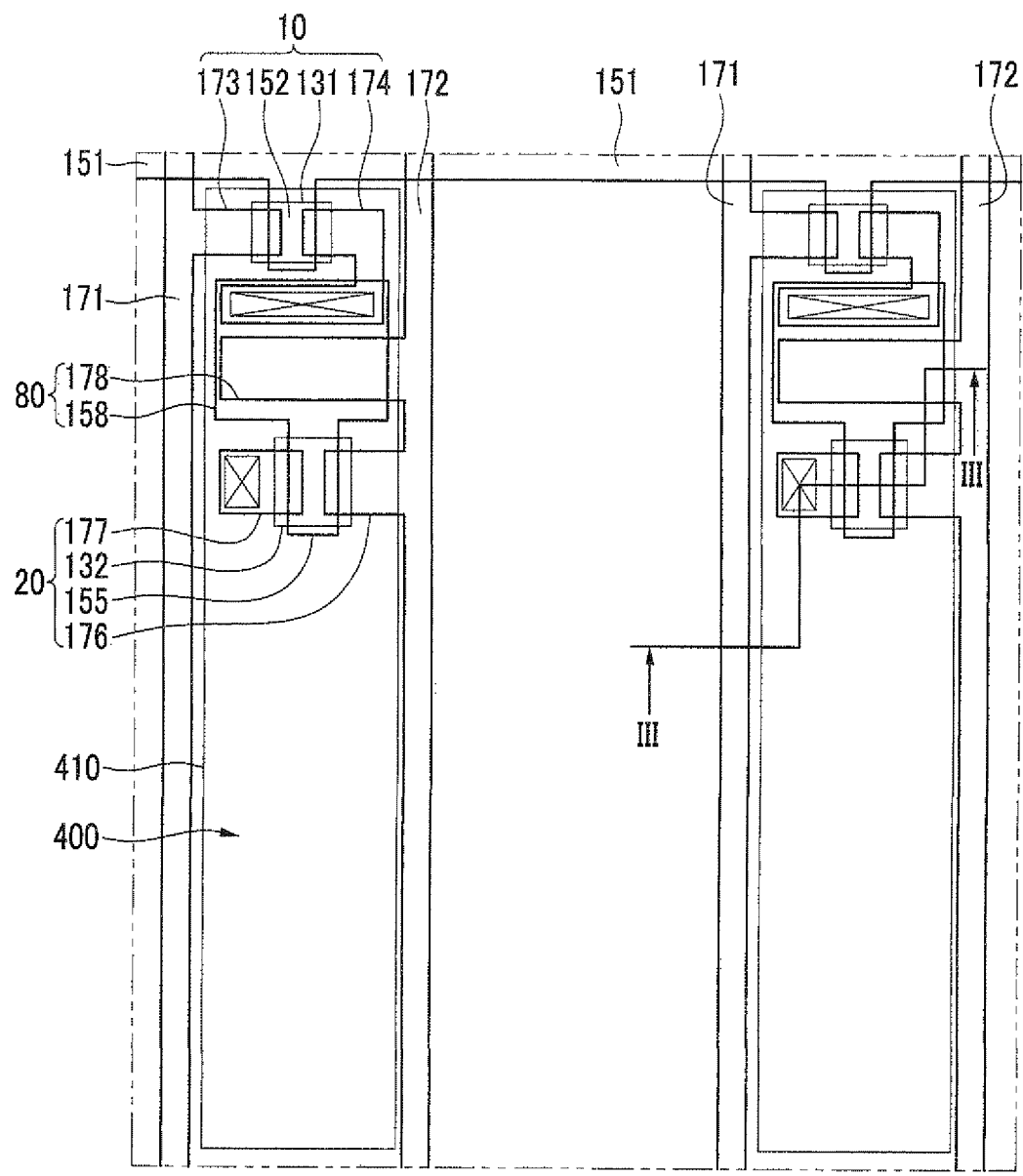
FIG. 2 is a layout view illustrating the structure of a pixel of the organic light emitting diode display according to the exemplary embodiment.
Figure 3:
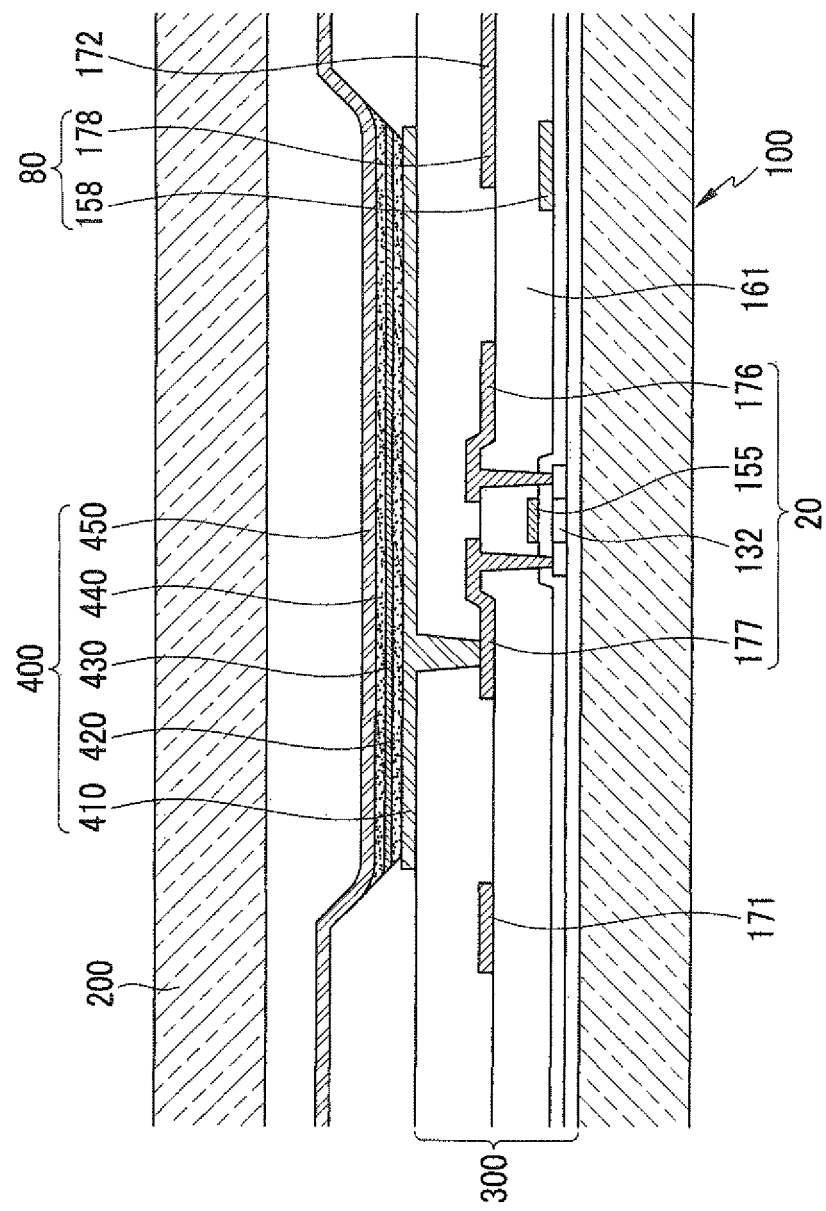
FIG. 3 is a cross-sectional view taken along line III-III of FIG. 2.

FIG. 2 is a layout view illustrating the structure of a pixel of the organic light emitting diode display according to the exemplary embodiment, and FIG. 3 is a cross-sectional view taken along line III-III of FIG. 2.

The detailed structures of the wiring part 300 and the organic light emitting diode 400 are shown in FIGS. 2 and 3, but the exemplary embodiment are not limited to the structures shown in FIGS. 2 and 3. The wiring part 300 and the organic light emitting diode 400 may be formed in various structures within the scope of the present invention and can be easily modified by those skilled in the art. For example, in the accompanying drawings, although the organic light emitting diode display is shown as an active matrix (AM) type organic light emitting diode display having a 2Tr-1Cap structure, which is provided with two thin film transistors (TFTs) and one storage capacitor in one pixel, the present invention is not limited thereto. Therefore, in the case of the organic light emitting diode display, the number of thin film transistors, the number of storage capacitors, and the number of wires are not limited. Meanwhile, the pixel represents the minimum unit displaying an image, and the organic light emitting diode display displays the image through a plurality of pixels.

As shown in FIGS. 2 and 3, the organic light emitting diode display includes a switching thin film transistor 10, a driving thin film transistor 20, a storage capacitor 80, and an organic light emitting diode 400 formed in each pixel. Herein, a configuration including the switching thin film transistor 10, the driving thin film transistor 20, and the storage capacitor 80 is referred to as the wiring part 300. In addition, the wiring part 300 further includes a gate line 151 disposed in one direction of the first substrate 100, and a data line 171 and a common power supply line 172 insulatively crossing the gate line 151. Herein, a boundary of one pixel may be defined by the gate line 151, the data line 171, and the common power supply line 172, but is not limited thereto.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177.

The switching thin film transistor 10 is used as a switching element which selects a desired pixel to emit light. The switching gate electrode 152 is connected to the gate line 151. The switching source electrode 173 is connected to the data line 171. The switching drain electrode 174 is spaced apart from the switching source electrode 173 and is connected to any one storage plate 158.

The driving thin film transistor 20 applies driving power for allowing the organic emission layer 440 of the organic light emitting diode 400 in the selected pixel to emit light to the second electrode 450. The driving gate electrode 155 is connected to the storage plate 158 which is connected to the switching drain electrode 174. Each of the driving source electrode 176 and the other storage plate 178 is connected to the common power supply line 172. The driving drain electrode 177 is connected to the first electrode 410 of the organic light emitting diode 400 through a contact hole.

The storage capacitor 80 includes a pair of storage plates 158 and 178 which are disposed with an interlayer insulating layer 161 interposed therebetween. Herein, the interlayer insulating layer 161 becomes a dielectric, and the storage capacity of the storage capacitor 80 is determined by electric charges stored in the storage capacitor 80 and voltage between both storage plates 158 and 178.

By this structure, the switching thin film transistor 10 is operated by gate voltage applied to the gate line 151 so as to serve to transfer data voltage applied to the data line 171 to the driving thin film transistor 20. Voltage equivalent to a difference between a common voltage applied to the driving thin film transistor 20 from the common power supply line 172 and the data voltage transmitted from the switching thin film transistor 10 is stored in the storage capacitor 80, and current corresponding to the voltage stored in the storage capacitor 80 flows to the organic light emitting diode 400 through the driving thin film transistor 20 so as to allow the organic light emitting diode 400 to emit light.

As seen in FIG. 3, the organic light emitting diode 400 includes the first electrode 410, an organic layer 420 positioned on the first electrode 410, a transflective layer 430 positioned on the organic layer 420, the organic emission layer 440 positioned on the transflective layer 430, and the second electrode 450 positioned on the organic emission layer 440. Herein, the transflective layer 430 is positioned in only a pixel corresponding to the organic emission layer 440 which emits blue light.

Figure 4:
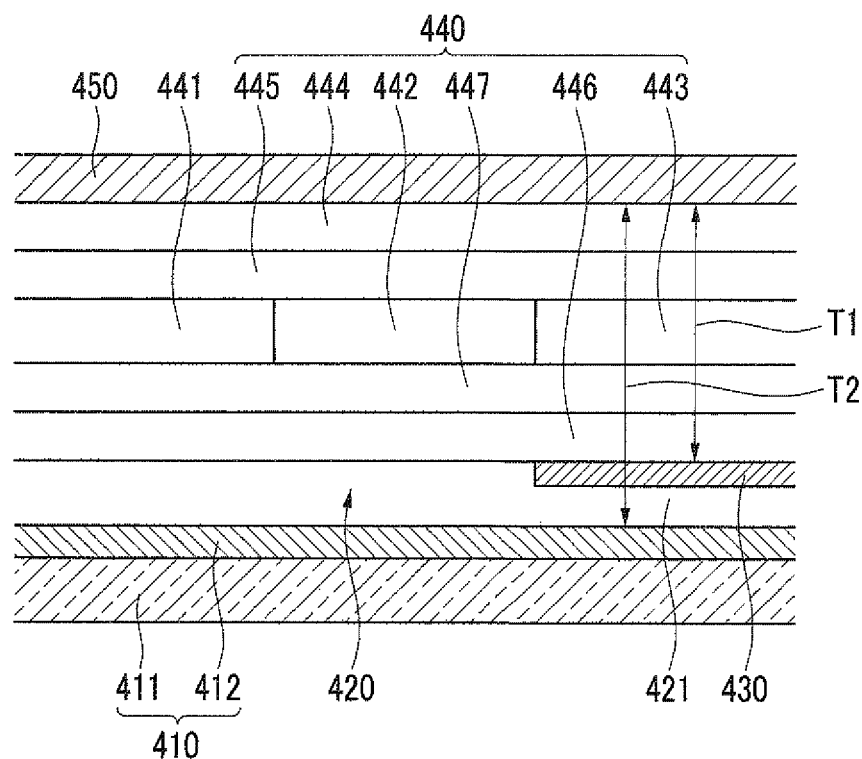
FIG. 4 is a cross-sectional view illustrating primary components in the organic light emitting diode display according to the exemplary embodiment.

FIG. 4 is a cross-sectional view illustrating primary components in the organic light emitting diode display according to the exemplary embodiment. FIG. 4 shows only the components constituting each organic light emitting diode positioned between adjacent pixels in the organic light emitting diode display for better understanding and ease of description.

As shown in FIG. 4, the first electrode 410 is an anode which is a hole injection electrode and the second electrode 450 is a cathode which is an electron injection electrode. However, the exemplary embodiment is not necessarily limited thereto. Therefore, the first electrode 410 may be the cathode and the second electrode 450 may be the anode according to a driving method of the organic light emitting diode display. Holes and electrons are injected into the organic emission layer 440 from the first electrode 410 and the second electrode 450, respectively. When an exciton generated by a combination of the holes and the electrons injected into the organic emission layer 440 falls from an excited state to a ground state, the organic emission layer 440 emits light. Furthermore, the first electrode 410 includes a first sub-electrode 411 containing a single-layer or multi-layer light reflective conducting material including at least one of aluminum (Al), silver (Ag), and the like, and a second sub-electrode 412 which is positioned on the first sub-electrode 411 and contains a conducting material having a high work function, such as indium tin oxide (ITO), or the like. The second electrode 450 faces the first electrode 410 with the organic layer 420, the transflective layer 430, and the organic emission layer 440 interposed therebetween, and contains a single-layer or multi-layer light transflective conducting material including at least one of aluminum (Al), silver (Ag), calcium (Ca), calcium-silver (CaAg), magnesium-silver (MgAg), and aluminum-silver (AlAg). The first electrode 410 has a thickness in the range of 1000 to 2000 Å, and the second electrode 450 has a thickness in the range of 500 to 2000 Å. The organic layer 420 is positioned on the first electrode 410.

The organic layer 420 is positioned between the first electrode 410 and the transflective layer 430 on the first electrode 410. The organic layer 420 includes a first hole injection layer 421 adjacent to the transflective layer 430. The first hole injection layer 421 serves to assist in smoothly injecting holes injected from the first electrode 410 into the organic emission layer 440. The organic layer 420 has a thickness in the range of 200 to 600 Å.

The transflective layer 430 is positioned on the organic layer 420 and between the organic layer 420 and the organic emission layer 440. The transflective layer 430 corresponds to a third main light emitting layer 443 which emits blue light to be described later, and which selectively reflects a part of blue light and transmits the remaining part of blue light which is emitted from the third main light emitting layer 443. The transflective layer 430 contains metal, and more specifically contains a single-layer or multi-layer light transflective conducting material including at least one of aluminum (Al), silver (Ag), calcium (Ca), calcium-silver (CaAg), magnesium-silver (MgAg), and aluminum-silver (AlAg). The transflective layer 430 has a thickness in the range of 60 to 2000 Å.

The organic emission layer 440 includes a first main light emitting layer 441 for emitting red light, a second main light emitting layer 442 for emitting green light, and a third main light emitting layer 443 for emitting blue light. Each of the first main light emitting layer 441, the second main light emitting layer 442, and the third main light emitting layer 443 emits light by combining holes and electrons injected from each of the first electrode 410 and the second electrode 450.

The organic emission layer 440 further includes an electron injection layer 444, an electron transport layer 445, a second hole injection layer 446, and a hole transport layer 447.

The electron injection layer 444 and the electron transport layer 445 are positioned between the second electrode 450 on one side and each of the first main light emitting layer 441, the second main light emitting layer 442, and the third main light emitting layer 443 on the other side, and serve to assist in smoothly injecting the electrons injected from the second electrode 450, which is a negative electrode, into the first main light emitting layer 441, the second main light emitting layer 442, and the third main light emitting layer 443.

The second hole injection layer 446 and the hole transport layer 447 are positioned between the first electrode 410 on one side and each of the first main light emitting layer 441 and the second main light emitting layer 442 on the other side, and between the transflective layer 430 and the third main light emitting layer 443, and serve to assist in smoothly injecting the holes injected from the first electrode 410, which is a positive electrode, into each of the first main light emitting layer 441, the second main light emitting layer 442, and the third main light emitting layer 443. In particular, the second hole injection layer 446, which is positioned between the transflective layer 430 and the third main light emitting layer 443, is adjacent to the transflective layer 430, and is a layer through which the holes injected from the first electrode 410 into the third main light emitting layer 443 pass.

A first thickness T1 of the organic emission layer 440 corresponding to the third main light emitting layer 443 is in the range of 600 to 800 Å, and the first thickness T1 in the range has a thickness of 700 Å to suit a wavelength of a color of blue light emitted from the third main light emitting layer 443. Furthermore, a second thickness T2 acquired by adding up the organic emission layer 440 corresponding to the third main light emitting layer 443, the organic layer 420, and the transflective layer 430, is in the range of 1000 to 3000 Å. As described above, the organic emission layer 440 has the first thickness T1 of 700 Å to suit the wavelength of the color of blue light emitted from the third main light emitting layer 443, and the second thickness T2, acquired by adding up the organic emission layer 440 corresponding to the third main light emitting layer 443, the organic layer 420, and the transflective layer 430, is in the range of 1000 Å or more so as to improve the light efficiency and color reproducibility of light emitted from the organic emission layer 440 and to prevent a dark spot from being generated in the light emitted from the organic emission layer 440. The reason why the effect is implemented in the organic light emitting diode display according to the exemplary embodiment will be described later.

Figures 5, 6:
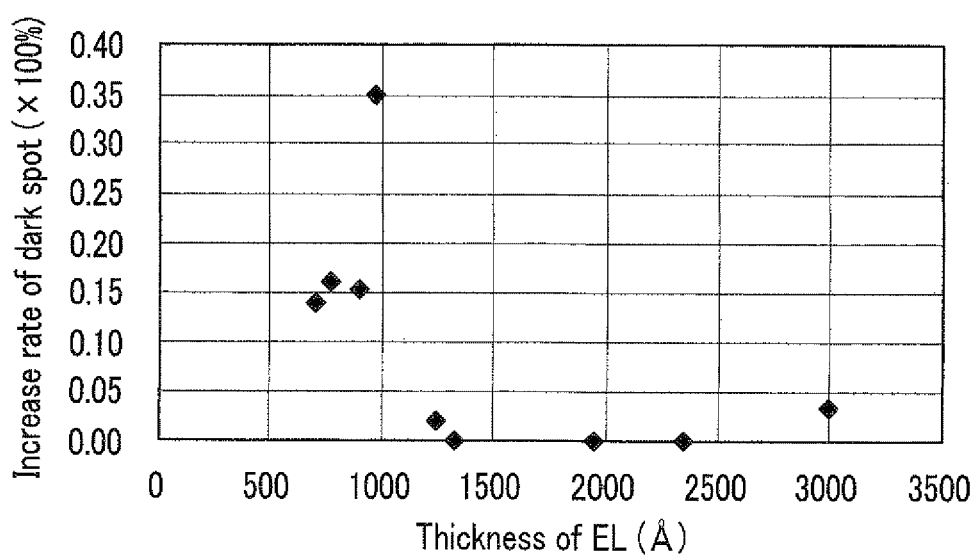
FIG. 5 is a table illustrating the thickness of an organic emission layer to implement a micro cavity effect depending on a wavelength of light emitted from the organic emission layer.
FIG. 6 is a graph illustrating the increase rate of a dark spot generated by the light emitted from the organic emission layer depending on the thickness of the organic emission layer.

FIG. 5 is a table illustrating the thickness of an organic emission layer to implement a micro cavity effect depending on a wavelength of light emitted from the organic emission layer.

As shown in FIG. 5, in order to implement the micro cavity effect so as to improve the light efficiency and color reproducibility of the light emitted from the organic emission layer 440, the thickness of the organic emission layer 440, including the first main light emitting layer 441 emitting red light, is preferably substantially 1300 Å; the thickness of the organic emission layer 440, including the second main light emitting layer 442 emitting green light, is preferably substantially 950 Å; and the thickness of the organic emission layer 440, including the third main light emitting layer 443 emitting blue light, is preferably substantially 700 Å.

As a result, the organic light emitting diode 400 of the organic light emitting diode display according to the exemplary embodiment is a top emission type which emits light toward the second substrate 200, and the transflective layer 430 is positioned between the organic emission layer 440, including the third main light emitting layer 443 emitting blue light, and the organic layer 420.

In such a structure, when the holes and the electrons are injected from each of the first electrode 410 and the second electrode 450 into the third main light emitting layer 443 emitting blue light, the third main light emitting layer 443 emits blue light toward the second electrode 450 and the transflective layer 430. In this case, a part of blue light irradiated from the third main light emitting layer 443 to the second electrode 450 is reflected by the second electrode 450, and the rest transmits from the second electrode 450. Furthermore, a part of blue light which is irradiated from the third main light emitting layer 443 to the transflective layer 430, or irradiated to the transflective layer 430 by being reflected by the second electrode 450, is reflected by the transflective layer 430, and the rest is reflected by the first electrode 410 by transmitting from the transflective layer 430. As such, a micro cavity structure is formed between the second electrode 450 and the transflective layer 430, and the thickness between the transflective layer 430 and the first electrode 410 is excluded from the micro cavity structure. Therefore, since the micro cavity effect of blue light emitted from the third main light emitting layer 443 is implemented within the organic emission layer 440, including the third main light emitting layer 443 having the first thickness T1 of 700 Å corresponding to the wavelength of the color of blue light, the light efficiency and color reproducibility of the organic light emitting diode display are improved.

FIG. 6 is a graph illustrating the increase rate of a dark spot generated by the light emitted from the organic emission layer depending on the thickness of the organic emission layer.

As shown in FIG. 6, the dark spot generated in the light emitted from the light emitting layer (EL) positioned between the first electrode 410 and the second electrode 450 is remarkably reduced when the light emitting layer (EL) has a thickness of 1000 Å or more.

Therefore, in the organic light emitting diode display according to the exemplary embodiment, by setting the second thickness T2, acquired by adding up the organic emission layer 440 corresponding to the third main light emitting layer 443, the organic layer 420, and the transflective layer 430, to the range of 1000 to 3000 Å, the second thickness T2, acquired by adding up the organic emission layer 440 corresponding to the third main light emitting layer 443 which is the light emitting layer (EL) positioned between the first electrode 410 and the second electrode 450, the organic layer 420, and the transflective layer 430, is in the range of 1000 Å or more, thereby preventing the dark spot from being generated in blue light emitted from the organic emission layer 440.

Hereinafter, an experimental example in which it is verified that the light efficiency and color reproducibility of blue light emitted from the organic emission layer 440 of the organic light emitting diode display according to the exemplary embodiment are improved, and the dark spot is prevented from being generated in blue light emitted from the organic emission layer 440, will be described with reference to FIG. 7. The thicknesses of components described below are represented by numbers in parentheses. The unit of the thickness is preferentially Å.

FIG. 7 is a cross-sectional view illustrating primary components in an organic light emitting diode display according to an experimental example of the embodiment. In FIG. 7, the organic emission layer 440, including the third main light emitting layer 443 emitting blue light, is primarily shown.

As shown in FIG. 7, the organic light emitting diode display according to the experimental example of the embodiment includes a first electrode, an organic layer, a transflective layer, an organic emission layer, and a second electrode.

The organic layer includes a first hole injection layer (HIL1 400 Å), the transflective layer [Metal(MgAg) 120 Å] the organic emission layer, and the second electrode [Cathode (MgAg) 160 Å] which are laminated on the first electrode (Ag 1000 Å, TIO 70 Å). The organic emission layer includes a second hole injection layer (HIL2 100 Å), a hole transport layer (HTL 150 Å), a third main light emitting layer (EML 200 Å), an electron transport layer (ETL 250 Å), and an electron injection layer (EIL 5 Å).

In the organic light emitting diode display according to the experimental example of the embodiment, the thickness of the organic emission layer, including the second hole injection layer (HIL2 100 Å), the hole transport layer (HTL 150 Å), the third main light emitting layer (EML 200 Å), the electron transport layer (ETL 250 Å), and the electron injection layer (EIL 5 Å), is 705 Å, which is substantially similar to 700 Å, which is the thickness to implement the micro cavity effect so as to improve the light efficiency and color reproducibility of blue light emitted from the third main light emitting layer (EML 200 Å). Furthermore, a thickness acquired by adding up the organic layer, including the first hole injection layer (HIL1 400 Å) positioned between the first electrode (Ag 1000 Å, TIO 70 Å) and the second electrode [Cathode(MgAg) 160 Å], the transflective layer [Metal(MgAg) 120 Å], and the organic emission layer 705, is 1225 Å which is more than 1000 Å, which is the thickness to prevent the dark spot from being generated so as to prevent the dark spot from being generated in blue light emitted from the third main light emitting layer (EML 200 Å).

As verified in the above-mentioned experiment, in the organic light emitting diode display according to the exemplary embodiment, a micro cavity structure having a first thickness T1 corresponding to a wavelength of a color of blue light emitted from the third main light emitting layer 443 is formed between the second electrode 450 and the transflective layer 430, and a thickness acquired by adding up the organic emission layer 440 corresponding to the third main light emitting layer 443 positioned between the first electrode 410 and the second electrode 450, the organic layer 420, and the transflective layer 430 is a second thickness T2 so as to improve the light efficiency and color reproducibility of the organic light emitting diode display, and to prevent the dark spot from being generated in blue light emitted from the organic emission layer 440.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
    a substrate;
    a first electrode positioned on the substrate;
    an organic layer positioned on the first electrode;
    an organic emission layer positioned on the organic layer, the organic emission layer comprising a first organic emission layer emitting first light, a second organic emission layer emitting second light having a wavelength shorter than a wavelength of the first light, and a third organic emission layer emitting third light having a wavelength shorter than the wavelength of the second light;
    a transflective layer coterminous in length with the third organic emission layer interposed between the third organic emission layer and the organic layer; and
    a second electrode positioned on the organic emission layer.

2. The organic light emitting diode display device of claim 1, wherein a thickness acquired by adding up the organic layer, the transflective layer, and the organic emission layer is in a range of 1000 to 3000 Å.

3. The organic light emitting diode display device of claim 1, wherein the third organic emission layer emits blue light.

4. The organic light emitting diode display device of claim 1, wherein the thickness of the organic emission layer is in a range of 600 to 800 Å.

5. The organic light emitting diode display device of claim 1, wherein the first electrode is an anode, wherein the organic layer includes a first hole injection layer adjacent to the transflective layer, and wherein the organic emission layer includes a second hole injection layer adjacent to the transflective layer.

6. The organic light emitting diode display device of claim 1, wherein the transflective layer contains metal.

7. The organic light emitting diode display device of claim 6, wherein the transflective layer contains at least one of aluminum (Al), silver (Ag), calcium (Ca), calcium-silver (CaAg), magnesium-silver (MgAg), and aluminum-silver (AlAg).

8. The organic light emitting diode display device of claim 7, wherein the first electrode is light-reflective, and wherein the second electrode is light-transflective.

9. The organic light emitting diode display device of claim 6, wherein the first electrode is light-reflective, and wherein the second electrode is light-transflective.

10. The organic light emitting diode display device of claim 5, wherein the first electrode is light-reflective, and wherein the second electrode is light-transflective.

11. The organic light emitting diode display device of claim 4, wherein the first electrode is light-reflective, and wherein the second electrode is light-transflective.

12. The organic light emitting diode display device of claim 3, wherein the first electrode is light-reflective, and wherein the second electrode is light-transflective.

13. The organic light emitting diode display device of claim 2, wherein the first electrode is light-reflective, and wherein the second electrode is light-transflective.

14. The organic light emitting diode display device of claim 1, wherein the first electrode is light-reflective, and wherein the second electrode is light-transflective.

* * * * *